United States Patent [19]

Meyers

[11] Patent Number: 5,070,509
[45] Date of Patent: Dec. 3, 1991

[54] SURFACE EMITTING, LOW THRESHOLD (SELTH) LASER DIODE

[75] Inventor: Mark M. Meyers, Hamlin, N.Y.

[73] Assignee: Eastman Kodak Company, Rochester, N.Y.

[21] Appl. No.: 564,930

[22] Filed: Aug. 9, 1990

[51] Int. Cl.[5] .............................................. H01S 3/19
[52] U.S. Cl. ....................................... 372/45; 372/20; 372/50; 372/96
[58] Field of Search ..................... 372/96, 45, 50, 46, 372/20

[56] References Cited

U.S. PATENT DOCUMENTS

| | | | |
|---|---|---|---|
| 4,006,432 | 2/1977 | Streifer et al. | 372/96 |
| 4,495,514 | 1/1985 | Lawrence et al. | 357/67 |
| 4,532,632 | 7/1985 | Yamashita et al. | 372/50 |
| 4,675,876 | 6/1987 | Svilans | 372/96 |
| 4,719,636 | 1/1988 | Yamaguchi | 372/50 |
| 4,751,710 | 6/1988 | Yamaguchi et al. | 372/50 |
| 4,802,187 | 1/1989 | Bouley et al. | 372/96 |
| 4,847,856 | 7/1989 | Sugimura et al. | 372/96 |
| 4,856,017 | 8/1989 | Ungar | 372/96 |
| 4,894,835 | 1/1990 | Uomi et al. | 372/45 |
| 4,920,542 | 4/1990 | Brosson et al. | 372/50 |
| 4,958,357 | 9/1990 | Kinoshita | 372/96 |

OTHER PUBLICATIONS

"Micro Lasers Blaze Ahead", Electronic Engineering Timer, Sep. 24, 1990.
"Japanese Push SHG Laser R and D", Electronic Engineering Times, Aug. 20, 1990.
"General Approaches to Mask Design for Binary Optics" by James Logue and Marilynn L. Chisholm, SPIE vol. 1052, Holographic Optics: Optically and Computer Generated (1989).

Primary Examiner—Georgia Epps
Attorney, Agent, or Firm—Mark Z. Dudley

[57] ABSTRACT

Two novel structures of a high-quantum efficiency, wavelength-tunable, surface-emitting, low threshold laser diode which optimally utilizes certain advantages of a distributed feedback (DFB) structure. The preferred embodiments combine a separate confinement heterostructure (SCH), surface-emitting distributed feedback laser diode structure with a multiple quantum well (MQW) active layer and an index-guiding buried heterostructure. A wave-length tuning section is included in the device structure for wavelength adjustment, and an arrangement of transparent electrodes useable for ohmic contacts to the device provide anti-reflection coatings for the emitting portion of the device. A first preferred embodiment is termed the SELTH laser diode (surface emitting, low threshold). A second, related preferred embodiment combines the SELTH laser diode structure with additional optical elements to provide a collimated output beam and is termed the COSELTH laser diode (collimated, surface emitting, low threshold).

13 Claims, 3 Drawing Sheets

SURFACE EMITTING, LOW THRESHOLD (SELTH) LASER DIODE

BACKGROUND OF THE INVENTION

1. Field of the Invention

This invention relates generally to a surface emitting laser diode, and more particularly to a low threshold, surface emitting distributed feedback laser diode.

2. Description of the Prior Art

The double heterostructure semiconductor laser diode provides optical waveguiding and carrier confinement in an active layer and is the basis for most modern laser diodes. One of the common methods of stimulating laser light emission is by the creation of a population inversion in the semiconductor with current injection in the gain media. If the applied current injection exceeds a threshold level, electron-hole pairs are stimulated and recombine to emit light with the direction and phase of the light in the waveguide of the resonant cavity. The electrical-to-optical conversion efficiency (differential quantum efficiency) for injection pumped lasers can be as high as 70% after the onset of threshold current. Thus, injection pumped semiconductor laser diodes are extremely attractive for a wide range of uses in optical and electroptical applications.

However, the laser threshold current is a function of, among other things, temperature. The threshold current density in a cleaved cavity laser diode is given by:

$$J_{th} = 4.5 \times 10^3 d/g + (20d/gC)(a_i + (1/L_{cavity})ln(1/R))$$

where:
  $g$ = quantum efficiency
  $C$ = confinement factor
  $R$ = intensity reflectance
  $d$ = active layer thickness
  $a_i$ = intrinsic absorption coefficient
  $L_{cavity}$ = laser cavity length Furthermore, the refractive index of the preferred semiconductive materials, such as AlGaAs or GaAs, is a function of temperature and injected current. The refractive index as a function of temperature is approximately given by:

$$dn(t) = 4 \times 10^{-4} dt$$

and the dependence on current (i) is:

$$dn(t) = -(i^* q^2 / 2m_{neff} x^2) n$$

where:
  $q$ = electron charge
  $m_{neff}$ = electron effective mass
  $x$ = radiation angular frequency
  $n$ = average refractive index of the semiconductor.

Accordingly, the refractive index increases with increasing temperature and decreases with increasing current.

The lasing wavelength of a cleaved cavity laser diode is directly proportional to the mechanical length of the laser cavity, which in turn is also a function of temperature. The lasing light has to satisfy the condition:

$$mk/2 = n_{GaAs} L_{cavity}$$

where:
  $L_{cavity}$ = length of the resonator cavity
  $n_{GaAs}$ = refractive index of laser active region
  $m$ = integer
  $k$ = wavelength Hence, the laser output beam wavelength varies; the typical output characteristic of a laser diode according to temperature of the device consists of sections with a linear slope and discontinuous "mode hops" where the wavelength changes by one cavity mode spacing (C/2L). Changes in wavelength of the diode under current modulation also occur. Such instability in the output wavelength is quite undesirable and decreases the coherence of the laser light. Coherence is a necessary feature of the output beam in that the laser light is often made to interfere with itself, which is important in interferometers and coherent communications systems.

Normally, light incident on an aperture is diffracted with the outermost angle being inversely proportional to the size of the aperture (i.e. smaller angles cause greater divergence). However, typical active layer thicknesses are on the order of 0.2 to 0.3 micrometer in a double heterostructure laser and are as small as 100 angstroms for quantum wells. As a result, typical half angle divergences H(fwhm) are 25 to 35 degrees perpendicular to the active layer.

Because the light output of a typical laser diode comes from a non-symmetrical aperture, the output beam is undesirably non-symmetrical as well. Typically, the angular divergence perpendicular to the active layer is 2 to 5 times the divergence parallel to the active layer.

Thus, two significant factors in the construction of a laser diode are the aperture and divergence of the emitted beam. Conventional laser diodes typically emit through an aperture of $0.2 \times 5$ micrometers, which is the result of the use of an extremely thin layer of semiconductive material, forming an active region, which is kept thin to eliminate the possibility of emission intensity distributions with higher order modes than the $TEM_{00}$ mode. The width of the aperture is either determined by a current blocking oxide stripe or a refractive index waveguide fabricated into the laser. Thin (0.2–0.3 micrometer) active layer construction is often used because such construction can decrease the lasing threshold current density.

Divergence in an edge-emitting laser diode is inversely proportional to the aperture size, and thus beam divergence is greatest in a direction perpendicular to the active layer. This causes the output from the laser to diverge at large angles, especially in edge-emitting laser diode. Typical edge-emitting laser diodes have half angle divergences of 34 degrees perpendicular to the active layer and 8 degrees parallel to the active layer. These wide divergence angles necessitate the use of a collimating lens with a high numerical aperture to refract the light into a plane wave. For comparison, it should be noted that gas (for example, HeNe) and solid-state lasers have output beams which are already collimated with divergences on the order of milliradians. Laser diodes constructed to provide such a mode of emission (surface mode), but with low divergence output, are be potentially useful in a large number of applications. Such devices have not been easily achieved, however.

The foregoing and other disadvantages of edge-emitting laser diodes therefore make them unsuitable for many applications. For example, in an area such as fiber optic communications, the foregoing disadvantages impede the use of edge emitting laser diodes, as the dispersion and absorption of glass fibers are minimized at certain wavelengths (1.3, 1.5 lm) and therefore variations in wavelength cause phase delays and pulse broadening. Laser wavelength mode hops are also associated with undesirable intensity noise in optical data storage devices such as compact optical storage disks.

When used in conjunction with an adjacent p/n junction, the wavelength of a laser diode can be tuned by changing the current in the adjacent diode. A surface emitting laser diode so constructed would allow for fiber optic communications with multiple beams of differing wavelength propagating in the same fiber. The beams could then be demultiplexed using a diffractive focusing feature which disperses the beam and focuses it onto an array of detectors, with one detector for each channel and each channel corresponding to a different wavelength.

Accordingly, a wavelength-tunable, low current threshold, low divergence surface emitting laser diode would be extremely attractive for use in in coherent optical communications, position measuring devices based on interferometers with outputs similar to linear encoders, optical systems using holographic optical elements whose properties are wavelength dependent, and for illuminating compact holographic optical disk read/write heads, holographic-based laser deflectors (hologons), and laser lenses.

Single or multiple versions of such a low threshold, low divergence surface emitting laser diode could also be formed along with other components such as GaAs MESFET's or photodiodes to form highly-useful integrated optical systems. The combination would also simplify the use of diffractive input/output couplers.

SUMMARY OF THE INVENTION

Two novel configurations of a high-quantum efficiency, wavelength-tunable, surface-emitting, low threshold laser diode have been devised which optimally utilize certain advantages of, among other things, what is known as a distributed feedback (DFB) structure. The preferred laser diode structures combine a separate confinement heterostructure (SCH), surface-emitting distributed feedback laser diode having a multiple quantum well (MQW) active layer with an index-guiding buried heterostructure. A phase modulating section is included in the device structure for wavelength tuning, and an arrangement of transparent electrodes useable for ohmic contacts to the device also provide anti-reflection coatings for the emitting portion of the device. The first configuration is termed the SELTH laser diode (surface emitting, low threshold). The second configuration is termed the COSELTH laser diode (collimated, surface emitting, low threshold).

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

Figure 1:
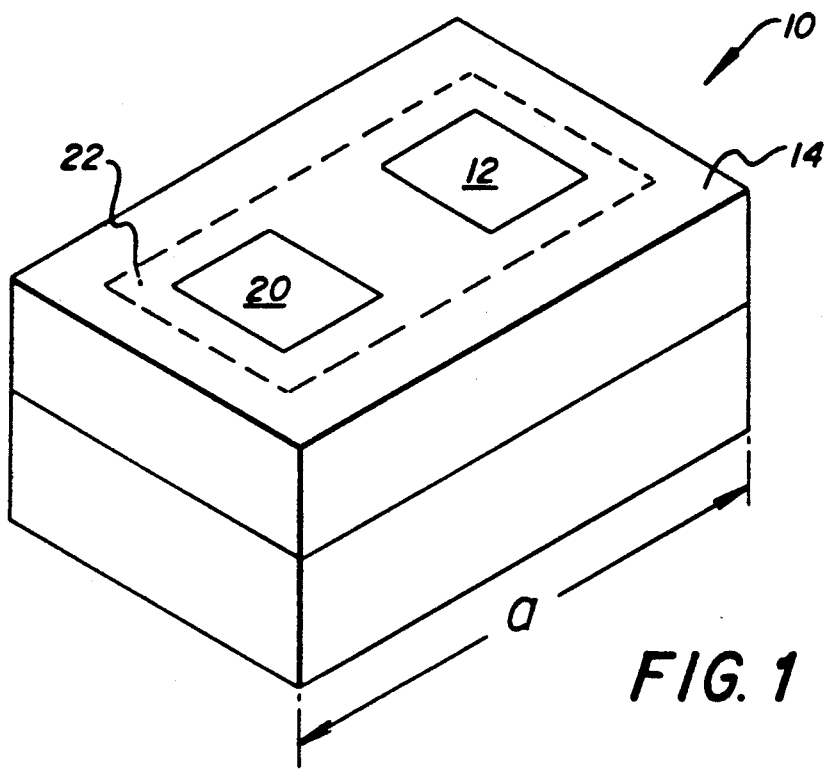
FIG. 1 illustrates a elevated perspective view of the SELTH laser diode constructed according to the invention.

Before describing the preferred embodiments of a laser diode constructed according to the invention, some basic concepts essential to an understanding of the contemplated laser diode structure will be discussed.

Distributed Feedback Laser Structure

Disadvantages in conventional laser diodes have been found to be eliminated or their effect reduced by use of a diode structure incorporating some type of periodic variation in the refractive index within the body of the semiconductor, to thus form a diffraction grating. These type of lasers include distributed feedback (DFB) lasers.

In distributed feedback lasers, the injection current passes through an etched grating near the active layer where light emission takes place. Light interacts with the grating as it propagates further along the waveguide. DFB lasers can be made to emit light perpendicular to the active layer through the top surface of the laser, or along the the active layer, depending on the diffracting feature spacing and profile.

Accordingly, I have devised a surface emitting laser diode structure that may be fabricated with an aperture of, for example, 300×200 micrometers, which therefore creates a relatively low divergence output beam. A reduction to a divergence of 1 degree from the conventional 34 degrees is feasible in the contemplated device.

Refractive Index Step Waveguide Structure

In my preferred embodiments of a laser diode constructed according to the invention, a refractive index step waveguide is provided parallel to an active layer. More specifically, a buried double heterostructure laser with separate confinement heretostructure is formed from a n-GaAS substrate having a n-$Al_xGa_{(1-x)}$As layer is epitaxially grown on it, followed by a multiple quantum well active layer and a p-$Al_yGa_{(1-y)}$As. A photoresist layer etch mask is formed on the wafer which covers a thin (approximately 3 micrometers) ridge. The wafer is etched down below the substrate and a mesa composed of the epitaxial layers is left standing. A burying layer of n-$Al_zGa_{(1-z)}$ as is then grown around the mesa. A $SiO_2$ current blocking oxide mask is then formed and an ohmic contact is applied.

In the contemplated double heterostructure, the active layer is surrounded on all sides by higher refractive index materials so the light is confined by total internal reflection. Hence, the structure is includable in the category of index guided laser structures and can be made to have almost no astigmatism. The contemplated structure offers a near square output beam intensity distribution (ratio of long to short beam axial length = 1.0). The use of a refractive index step to define the emission aperture on all sides in a surface emitting DFB laser is a novel feature of the contemplated laser diodes.

In the contemplated design of the distributed feedback section, the grating pitch can be chosen so that the light emerges perpendicular to the active layer. This provides a relatively large emission aperture and results in correspondingly less divergence. The emission aperture of the contemplated design can be as large as 300×200 micrometers. One might want to reduce the aperture to a 200×200 micrometers aperture to limit the amount of power to be dissipated in the body of the device. In either case, however, the aperture is much larger than the laser wavelength (0.78 or 0.83 micrometers) and Fraunhofer diffraction theory can be used to calculate the far field intensity distribution resulting from passing through a rectangular slit.

The surface emission from the contemplated design is, therefore, nearly collimated (approximately 1 degree divergence angle vs the 25 to 35 degree divergence from a edge emitting laser).

Transparent Electrode Structure

Another novel feature in the SELTH design is the use of of a transparent electrode material such as Indium Tin Oxide (ITO) or Cadmium Tin Oxide (CTO) to allow light to escape from the laser diode without being reflected by metal ohmic contact materials such as gold, nickel and their alloys. By using a transparent electrode one avoids energy losses by absorption of reflected light in the crystal. Also, the possibility of bright and dim bands appearing across the laser diode as a result of fabry-perot interference between the top and bottom of the laser diode are avoided.

Furthermore, the electrode acts as a anti-reflection coating for light emerging normal to the crystal surface. Details on the contemplated ITO or CTO electrode structure are found in U.S. Pat. No. 4,495,514, issued to Lawrence et al. on Jan. 22, 1985, the disclosure of which is hereby incorporated by reference.

The SELTH Laser Diode

Turning now to the illustrations, and to FIG. 1 in particular, a preferred embodiment of a SELTH laser diode 10 includes a separate confinement heterostructure (SCH) having a surface emitting DFB laser section 12 with a multiple quantum well active layer (MQW). A buried heterostructure 14 is provided for index guiding. The SELTH includes a wavelength tuning section 20 for wavelength tuning and a transparent electrode structure 22 for the ohmic contact which also acts as an anti-reflection coating. The SELTH device may be fabricated in a generally planar cubic structure, for example with dimension a=approximately 300 mm on a side.

SELTH Laser Structure

Figure 2:
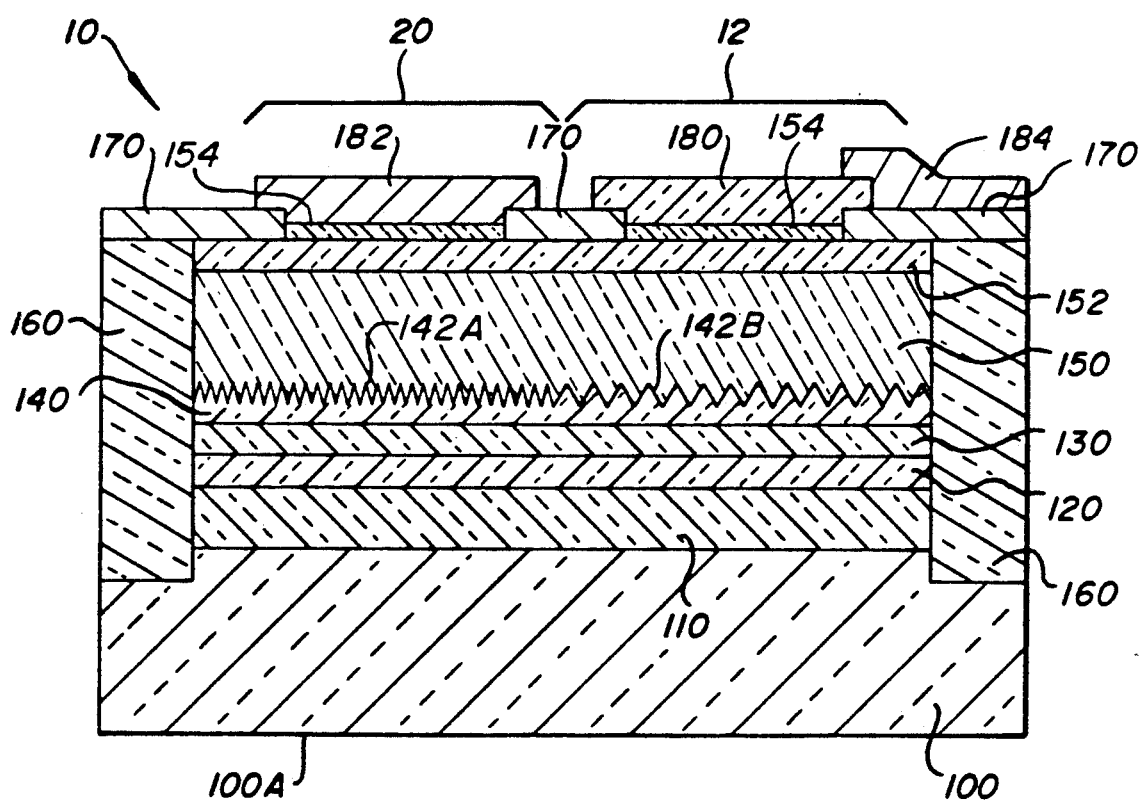
FIG. 2 is a side cross-sectional view of the device structure of FIG. 1.

As shown in FIG. 2, the SELTH device 10 is composed of a n-GaAs substrate 100 with a 2.0 micrometer thick layer 110 of N-$Al_{0.3}Ga_{0.7}As$ followed by a 0.2 micrometer thick layer 120 of N-$Al_{0.12}Ga_{0.88}As$. A multiple quantum well (MQW) active layer 130 consists of 10 layers of 80 angstrom thick $Ga_{0.96}Al_{0.04}As$ quantum wells sandwiched between 11 barrier layers of 80 angstrom thick $Al_{0.34}Ga_{0.66}As$. The MQW active layer 130 is followed by a 0.2 micrometer thick P-$Al_{0.12}Ga_{0.88}As$ layer 140 on which is formed a linear grating 142. In the illustrated embodiment, the grating 142 includes first and second order gratings 142A, 142B. It is contemplated that for ease of fabrication or other reasons dependent upon the application of the SELTH device 10, the first order grating may be formed either partially or wholly into the tuning section 20.

A P-$Al_{0.3}Ga_{0.7}As$ layer 150 is formed above the layer 140 and grating 142. A p-GaAs layer 152 is grown. A mesa is etched, leaving the DFB and tuning section. An epitaxial burying heterostructure 160 is then selectively regrown around the plasma etched mesa formed of the foregoing layers. The burying heterostructure 160 thereby surrounds the DFB 12 and wavelength tuning 20 sections.

Windows 170 of $SiO_2$ are formed and a very thin contact layer 154 of Chromium (Cr) is formed to facilitate ohmic contact. The electrode 182 can be formed from gold-zinc (AuZn), AuCr, or Cr. A standard alloy is useable for electrode 182 as it need not be transparent. The ITO electrode 180 is used over the DFB section 12 in a thickness which is an odd integral multiple of $k_{laser}/4_n$ to allow ohmic contact and act as a anti-reflection transmissive coating. A gold-zinc (AuZn) or chrome (Cr) contact 184 is formed on the ITO or CTO electrode 180 to facilitate a wirebond connection to the electrode 180.

Fabrication Process for the SELTH Laser Diode

The SELTH growth or fabrication process starts with the n-GaAs substrate 100. Since the device structure includes a MQW active layer, either molecular beam epitaxy (MBE) or metalorganic chemical vapor deposition (MOCVD) is preferred for at least part of the growth process. Since it is desirable to avoid meltback of the grating 142, liquid phase epitaxy (LPE) is not preferred for formation of the layers after the grating is formed on the P-$Al_{0.12}Ga_{0.88}As$.

Preferably, MOCVD or MBE is used for the whole growth process. Also preferred are n type dopants of Si or Se and p type dopants of Zn or Mg. The SELTH device can be made to operate at 830 or 780 nm. For the purposes of clarity, a device construction for operation at 830 nm device operation will be presented. Variations in structure and fabrication to achieve other output wavelengths may be achieved as known in the art.

The substrate 100 which will later receive a metallized layer 100A is inserted into an MOCVD growth apparatus and a 2.0 micrometer thick layer of N-$Al_{0.3}Ga_{0.7}As$ is grown. This is followed by a 0.2 micrometer thick layer of N-$Al_{0.12}Ga_{0.88}As$ for the SCH. A MQW active layer composed of alternating layers of P-$Al_{0.34}Ga_{0.66}As$ and p-$Ga_{0.96}Al_{0.04}As$ is grown using 11 P-$Al_{0.34}Ga_{0.66}As$ layers 80 angstroms thick and 10 layers of p-$Ga_{0.96}Al_{0.04}As$ 80 angstroms thick. The active layer is followed by the 0.2 micrometer thick P-$Al_{0.12}Ga_{0.88}As$ layer used as the other half of the SCH structure. The wafer is then removed from the MOCVD apparatus and cleaned.

A photoresist layer is spin coated onto the wafer to form the desired grating 142. Shipley AZ 1350 positive photoresist has been used successfully. Preferably, first and second order linear gratings are imaged on the photoresist by a holographic exposure apparatus. In such an apparatus, a collimated laser beam is incident on a prism which bends each half of a laser beam to be incident on the wafer symmetrically. The preferred grating period is 0.2311 micrometer (for k=0.83 micrometer). The photoresist is then developed in a developer, rinsed in distilled water and dried.

The photomask is transferred into the P-$Al_{0.12}Ga_{0.88}As$ layer using reactive ion etching (RIE). To do so, the wafer is inserted into the RIE apparatus and a plasma using Cl as the reactive ion is used to etch the photomask pattern.

The wafer is then reinserted into the MOCVD reactor. The 2.0 micrometer thick layer of P-$Al_{0.3}Ga_{0.7}As$ is grown over the grating. This is followed by the 1.0 micrometer thick layer of p-GaAs used to facilitate the ohmic contact. The device is then removed from the MOCVD reactor.

An SiO$_2$ layer is grown over the wafer using a CVD process. A photomask is formed over the DFB and wavelength tuning sections and the structure is etched down to the n-GaAs substrate. The device is reinserted in the MOCVD apparatus and the epitaxial burying layer of N-Al$_{0.4}$Ga$_{0.6}$As is grown around the mesa. The epitaxial will not grow on the SiO$_2$ layer and will only grow around the mesa. The growth is stopped when the burying layer is even with the mesa. The burying layer provides the index guiding feature and optically isolates the individual lasers from each other. The wafer is removed from the MOCVD apparatus and the SiO$_2$ layer is removed.

Another layer of SiO$_2$ is formed and windows are opened over the DFB section to allow for ohmic contact thereto. A thin (20 angstroms) layer of "chromium" is vacuum deposited on the wafer to reduce the contact voltage associated with the ITO or CTO transparent electrodes. Then a layer of ITO is vacuum deposited with a thickness (around 1.5 micrometers) adjusted to be equal to an odd integral multiple of $k_{laser}/4n_{ITO}$ so that it may act as an anti-reflection coating as well as an ohmic contact. The electrode is then annealed.

Another set of windows is opened over the wavelength tuning section. The Au-Zn or Cr electrode is formed over the wavelength tuning section and in contact with the ITO or CTO electrode to allow for wirebonding to the device.

The wafer is then removed form the vacuum deposition apparatus and tested for yield. According to known processes, the wafer is scribed and broken into individual lasers or small arrays of lasers (depending on the application). The devices are soldered to a heat sink and a wire bond is made to each (just outside the emission aperture). The packaging is completed and the laser diodes are ready for use.

Advantages of The SELTH Laser Diode

The contemplated SELTH device 10 incorporates a separate confinement heterostructure (SCH) which acts as a waveguide and eliminates nonradiative recombination currents at the active layer interface. The use of two layers with equal thickness and equal composition for the SCH provides for a symmetrical intensity distribution in the waveguide. By making these layers very thin the light in the waveguide is strongly coupled to the grating on the P-Al$_{0.12}$Ga$_{0.88}$As layer.

The use of an MQW active layer allows the device to lase at a low threshold current and will reduce the dependence of the threshold current on temperature. It is contemplated that the threshold can be reduced below 1 ma and thus the device may be able to be used as a thresholdless laser diode. The MQW active layer also decreases the heat dissipation margin necessary in the device due to the ohmic heat caused by the threshold current. The MQW structure increases the optical and carrier confinement in the active layer compared to bulk active layers.

The use of a second order grating allows the light emission to be coupled out of the DFB section in a direction perpendicular to the active layer. This permits a symmetrical (square) output beam (150 micrometers by 150 micrometers) with a low divergence (approximately 1 degree) to emerge from the top face of the laser. The grating feedback stabilizes the output wavelength with respect to temperature so that over the normal operating range of temperatures the SELTH laser diode is nearly athermal and does not mode hop to other wavelengths. This is critical for applications which require coherent, single frequency monochromatic light output.

The surface emission configuration combined with the index guiding buried heterostructure will eliminate or greatly reduce the astigmatism often found in laser diodes. The light is emitted from the active layer, which is less than 0.2 micrometer thick, and the use of the index guiding feature tends to eliminate the possibility that light will appear to be emitted from different depths in the crystal. The low divergence coupled with elimination of astigmatism will allow the SELTH laser diode to be used in many applications without a collimating lens.

By optimizing the grating profile, the light output from the DFB section can be made uniform. This achieved according to the known theory in case of critical coupling. Uniform output of the device is useful in laser printing and other imaging applications.

Another advantage of the SELTH design is the achievement of a higher than average output power level. The light emission at the output surface is emitted from a much larger area and consequently is not limited by the optical damage thresholds found in, for example, cleaved facet lasers. For instance, a cleaved facet laser may have an output aperture of 5×0.2 micrometers (aperture area=1.0 micrometers$^2$) whereas a SELTH laser diode with an output aperture of 150×150 micrometer has a aperture area of $2.25 \times 10^4$ micrometer$^2$. The factor of a $2.25 \times 10^4$ difference in surface area will allow for a much higher damage threshold in the SELTH design if applied to the fabrication of a high power laser diode.

The wavelength tuning section is extremely useful in suppressing device operation at two output wavelengths, and further allows for adjustment of the laser operating wavelength. The output wavelengths of random batches of commercially-available laser diodes typically vary about their nominal value by ±5 nm. This creates a need to utilize achromatized (wavelength insensitive) optics, or individually compensating for different laser wavelengths when making large quantities of devices using laser diodes. However, a SELTH laser diode may be made tunable over a range of 5 nm and may be produced and divided into 2 device batches. The devices may then be used in various systems with unachromatized optics (designed for one of two wavelengths) and still perform as expected. This capability of the device is especially important for use with holographic optical elements.

The buried heterostructure provides excellent optical confinement of light in the waveguide. By continuing the etched grating as a first or second order grating beyond the current-driven region of the active layer, the grating can contribute to the optical isolation by scattering light out of the waveguide. This fact can be used to make one and two dimensional arrays of laser diodes which can be modulated separately from each other without optical or electrical cross talk. This can be very useful for applications such as multiple beam laser printers (which write 3 or 4 images at once), optical computing (where a two dimensional array of laser diodes could be used for matrix manipulation) and multiple laser optical disk heads (one laser for writing on the disk, one for reading off the disk). If the devices are to be diced into individual lasers, the edges are rough sawn so as to prevent optical feedback from the facets.

In sum, the SELTH laser diode offers very high quantum efficiencies (due to the MQW active layer), low power consumption (due to low threshold current and high quantum efficiency), smaller thermal dissipation requirements, a major decrease in package size relative to Nd:Yag, HeNe or Argon lasers, and potentially higher output power than available in single frequency commercial laser diodes.

The COSELTH Laser Diode

Figure 3:
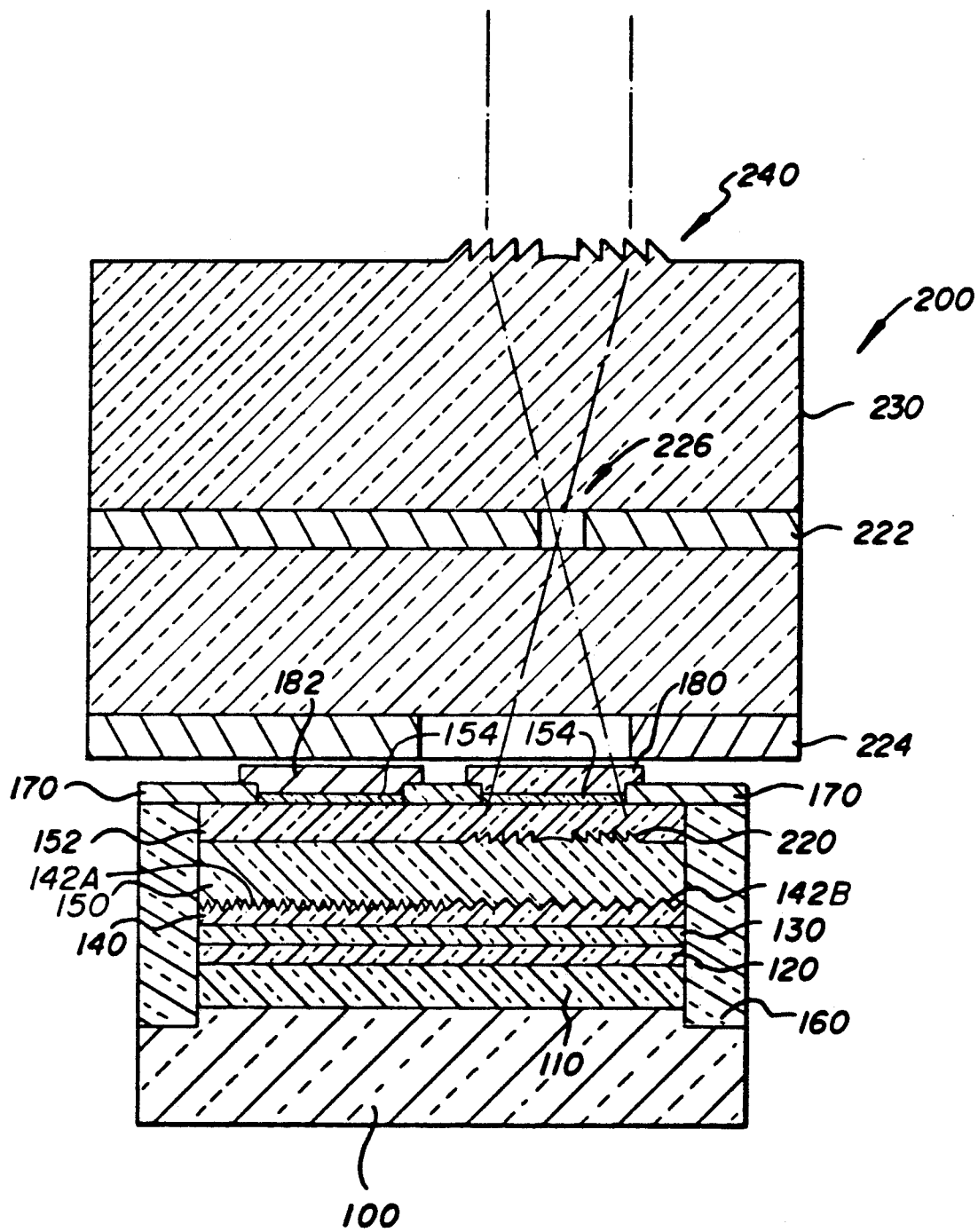
FIG. 3 is a side cross-sectional view of the COSELTH laser diode constructed according to the invention.

Turning now to FIG. 3, a second embodiment of a laser diode constructed according to the invention is shown. The COSELTH laser diode 200 is fabricated using a SELTH diode structure 10 having additional elements to provide an expanded and exactly collimated beam having a divergence limited only by diffraction. The COSELTH design also compensates for non-uniformities caused by imperfections in the laser structure or tendencies for the device to lase in filaments.

The structure of laser diode 200 is the same as that of SELTH 10 with the exception that a diffractive lens 220 is incorporated above the $Al_{0.3}Ga_{0.7}As$ layer 150 or the p-GaAs layer 152. The preferred diffractive lens 220 is a surface relief lens of the type considered as a blazed, bleached, or binary lens, or may be a digital hologram or kinoform. The diffractive lens will provide a collimated wavefront diffracted by the linear grating adjacent to the active layer. The lens focuses the collimated wavefront to a point outside of the laser.

Fabrication of the COSELTH Laser Diode

The fabrication of the COSELTH laser diode 200 is the same as for SELTH laser diode 10 except that the wafer is removed from the MOCVD apparatus after the growth of the $P-Al_{0.3}Ga_{0.7}As$ layer 150 and a series of binary masks are contacted printed and etched into the wafer to form a surface relief lens 220. The device is then reinserted into the MOCVD reactor and the p-GaAs layer 152 is grown.

The diffractive lens is formed from a series of linearly ramped grating teeth etched into the $P-Al_{0.3}Ga_{0.7}As$ layer (as shown in FIG. 3) or on the electrode 180 by a multi-level photomasks as described by Logue and Chisholm in "General approaches to mask design for binary optics", SPIE 1052, Holographic Optics, pg. 19, 1989. In such diffractive lens technology, a series of binary chrome-on-glass masks are made and then contact printed onto photoresist on the wafer. Each layer is then etched before another level of the mask is contact printed and etched. Between 4 and 16 masks can be used to approximate the parabolic surface relief profile necessary for 100% diffraction efficiency. Normally a stepped linear ramp surface relief is arrived which approximates the parabolic profile. Sixteen mask level kinoforms can have up to 99% diffraction efficiency.

A glass plate 230 is prepared with a metallized ring layer 224 for ohmic contacting coated on one side. An inner layer 222 is formed of an opaque material (metal or an absorbing layer) which has a small aperture 226 aligned to the center of the metal contact ring layer 224. The aperture 226 acts as a spatial filter if the thickness of the intervening glass is adjusted to be at the focal point of the diffractive lens. The diffractive lens 220 acts as an optical fourier transform lens for the incoming beam and the high frequency noise in the laser beam is obstructed by the aperture 226.

The size of the aperture can be calculated by considering the equation for the diffraction limited spot size formed by a lens with a given focal length:

$$SS = c*k*fl./D_{beam}$$

where
  c = constant which depends on the desired degree of obscuration (typically 1.5 to 2.5)
  fl. = focal length of the diffractive lens
  $D_{beam}$ = diameter of the beam on the diffractive lens (150 micrometers in this case)

For example, if a focal length of 1 mm is chosen and c = 2.0 the aperture diameter is 11.1 micrometers.

The light exiting the aperture is then recollimated into a beam whose size is determined by the focal length and numerical aperture of the diffractive lens and a collimator lens. For instance, if the output from the diffractive lens has a numerical aperture of 0.5 and a F/1 collimator lens with a 5 mm focal length is used, the output beam is 5 mm in diameter. Shorter or longer focal lengths can be chosen with corresponding smaller and larger output beam diameters. If a zooming collimator lens 240 is used, the output beam diameter can be adjustable.

The collimator lens 240 can be made as a surface relief diffractive lens in the plate 230, or in plastic, or as a volume holographic lens using dichromated gelatin or photopolymer as the holographic medium. The use of a holographic or diffractive element as the collimator lens 240 makes the COSELTH 200 less expensive and easier to package. Various configurations using holographic and glass lenses for collimator lenses 240 are known in the art.

The remainder of the process for the SELTH laser is completed until the wire bonding step, at which point the COSELTH laser is centered on the electrodes 180, 182 and aligned to a spatial filter aperture. It is unnecessary to apply a metal electrode to the COSELTH laser since it is contacted to the electrodes on the glass plate. This would allow the use of ITO or CTO for electrode 182 on the wavelength tuning section and eliminates a processing step. Finally the collimator lens is aligned to the output from the spatial filter and the aligned device is sealed in its package.

Figure 4A:
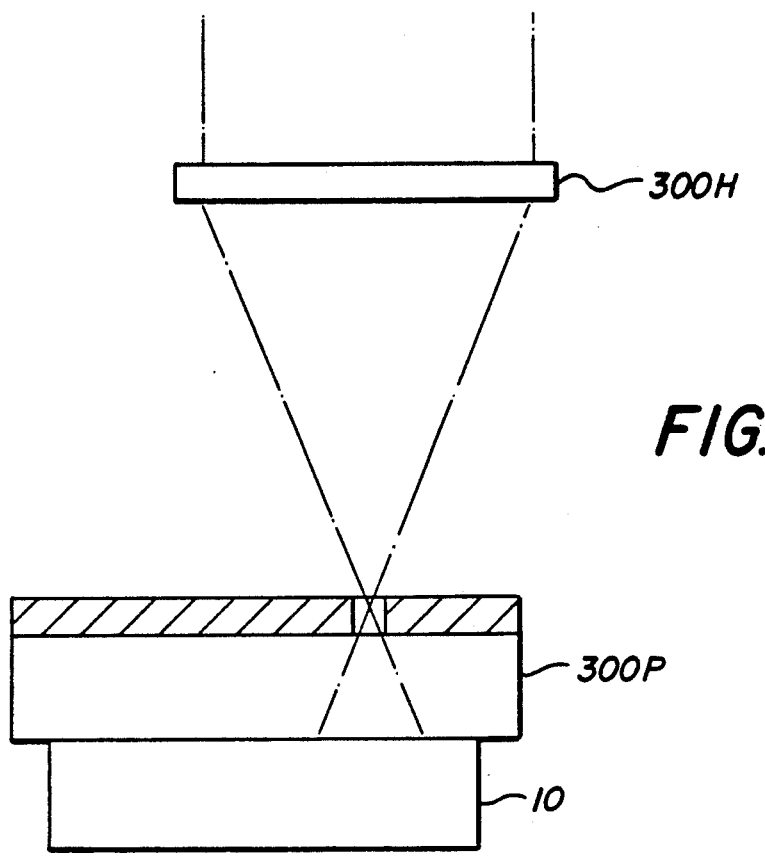
FIGS. 4A and 4B are side cross-sectional views of optical structures which use a SELTH laser diode.
Figure 4B:
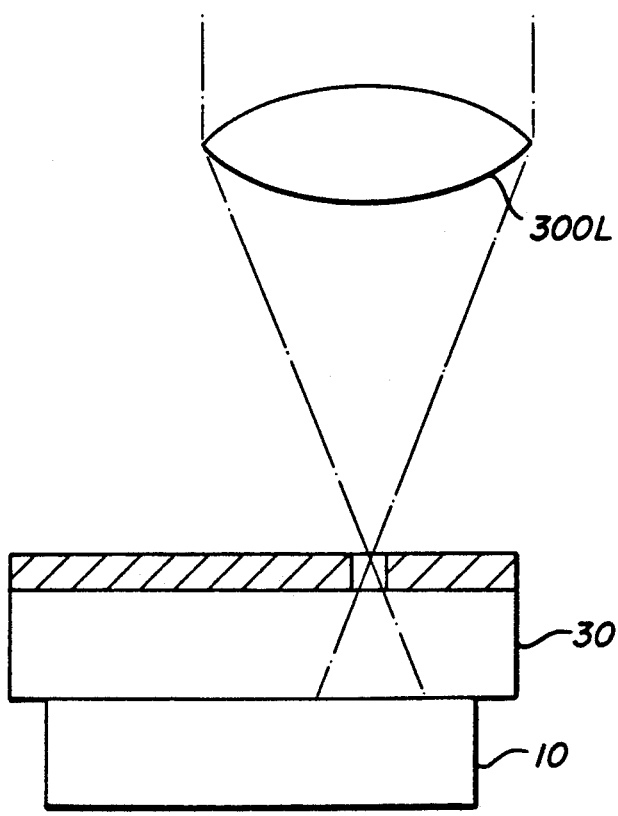

It is contemplated that the COSELTH laser diode 200 can be approximated by aligning a SELTH laser 10 to a holographic or conventional glass lens 300H or 300L, respectively external to the SELTH laser 10 mounted on an apertured plate 300P as shown in FIGS. 4A and 4B.

The COSELTH laser affords the advantages of SELTH laser and offers an expanded output beam with a smooth intensity profile. The collimation achieved with a COSELTH-based laser beam system can result in beam divergences on the order of milliradians. The COSELTH thus offers a stable output wavelength with high quantum efficiency. The contemplated device offers a collimated output beam having a smooth and uniform intensity distribution from a package size that can be as small as a cube 5 mm on a side. It is also inexpensive to produce compared to competing gas and solid state lasers.

The invention has been described in detail with particular reference to preferred embodiments thereof, but it will be understood that variations and modifications can be effected within the spirit and scope of the invention.

I claim:

1. A surface emitting semiconductor laser diode structure formed on a substrate, the structure comprising:
   a first section operable for wavelength tuning and an adjacent second section for effecting surface-emission of laser light, the first and second sections including:
   an optical waveguide having an active layer for the generation of laser light and a separate confinement heterostructure (SCH) having plural heterojunctions operatively connected to the optical waveguide;
   means for providing periodic variation in the refractive index of at least one of the surrounding heterojunctions to provide optical coupling of the laser light to the second section;
   an index-guiding buried heterostructure operatively connected to the optical waveguide for partial confinement of the laser light; and
   means operably connected to the second section for effecting current flow therethrough for inducing emission of laser light.

2. The surface emitting semiconductor laser diode structure of claim 1, wherein the first section further comprises:
   a semiconductive diode junction; and
   electrode means operably connected to the semiconductive diode junction for effecting phase-modulated tuning of the laser light output.

3. The surface emitting semiconductor laser diode structure of claim 1, wherein the separate confinement heterostructure further comprises:
   a separate confinement layer superimposed on the active layer;
   an upper dielectric layer superimposed on the separate confinement layer; and
   a lower dielectric layer underlying the active layer.

4. The surface emitting semiconductor laser diode structure of claim 3, wherein the active layer further comprises plural layers of quantum wells each of which have adjacent semiconductive barrier layers.

5. The surface emitting semiconductor laser diode structure of claim 3, wherein the means for providing periodic variation further comprises a diffractive grating formed on the separate confinement layer, the grating being operable for coupling light to the second section.

6. The surface emitting semiconductor laser diode structure of claim 5, wherein the diffractive grating comprises first and second portions respectively associated with the first and second sections, the first portion having a first order periodicity and the second portion having a second order periodicity.

7. The surface emitting semiconductor laser diode structure of claim 1, wherein the means for effecting current flow further comprises:
   transparent electrode means operable as an antireflection coating with respect to the laser light surface emission, the electrode means being operably connected as an ohmic contact to the second section; and
   a contact means operably connected for enhancing electrical contact to the transparent electrode means;
   the transparent electrode means and metallic contact means being together located in the emitting portion of the second section.

8. The surface emitting semiconductor laser diode structure of claim 7, wherein the transparent electrode is formed of Indium-Tin-Oxide (ITO) material.

9. The surface emitting semiconductor laser diode structure of claim 7, wherein the transparent electrode is formed of Cadmium-Tin-Oxide (CTO) material.

10. A surface emitting semiconductor laser diode structure, comprising:
    a substrate;
    a plurality of semiconductive material layers formed on said substrate, said plurality of layers forming an output wavelength tuning section and a distributed feedback (DFB) section, said plurality of layers including:
    a multiple quantum well active layer formed of plural quantum well layers, each quantum well layer having shared adjacent barrier layers;
    a separate confinement heterostructure, operably connected to the active layer, that includes an integrally-formed diffractive grating; and
    an epitaxial burying heterostructure, formed around said plurality of semiconductive material layers, for partial confinement of the laser light.

11. A surface emitting semiconductor laser diode structure formed on a substrate, the structure comprising in succession:
    a first layer of $N-Al_xGa_{1-x}As$;
    a second layer of $N-Al_yGa_{1-y}As$;
    a third layer forming a multiple quantum well active layer, the third layer having plural layers of $Ga_{1-z}Al_zAs$ quantum wells each having adjacent barrier layers of $Al_bGa_{1-b}As$;
    a fourth layer of $P-Al_yGa_{1-y}As$ incorporating a diffractive grating formed therein;
    a fifth layer of $P-Al_xGa_{1-x}As$;
    a sixth layer of P-GaAs;
    and the structure further comprising:
    an epitaxial burying heterostructure formed laterally adjacent the first through sixth layers;
    a transparent electrode superimposed on the sixth layer; and
    a metal alloy ohmic contact superimposed on the transparent electrode.

12. The laser diode structure of claim 11, wherein $x=0.3$; $y=0.12$; $z=0.96$; and $b=0.34$.

13. A collimated surface emitting semiconductor laser diode structure, comprising:
    a first section operable for wavelength tuning and an adjacent second section for effecting surface-emission of laser light, the first and second sections including:
    an optical waveguide having an active layer for the generation of laser light and a separate confinement heterostructure (SCH) having plural heterojunctions operatively connected to the optical waveguide;
    means for providing periodic variation in the refractive index of at least one of the surrounding heterojunctions to provide optical coupling of the laser light to the second section;
    an index-guiding buried heterostructure operatively connected to the optical waveguide for partial confinement of the laser light;
    means operably connected to the second section for effecting current flow therethrough for inducing emission of laser light; and
    a diffractive lens, formed in the second section, the diffractive lens being operable to collimate the laser light optically coupled to the second section.

* * * * *